(12) United States Patent
Han

(10) Patent No.: US 10,770,445 B2
(45) Date of Patent: Sep. 8, 2020

(54) METHODS OF FABRICATING SEMICONDUCTOR PACKAGES INCLUDING REINFORCEMENT TOP DIE

(71) Applicant: SK hynix Inc., Icheon-si, Gyeonggi-do (KR)

(72) Inventor: Kwon Whan Han, Seoul (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 16/176,806

(22) Filed: Oct. 31, 2018

(65) Prior Publication Data

US 2019/0259743 A1    Aug. 22, 2019

(30) Foreign Application Priority Data

Feb. 19, 2018    (KR) .................. 10-2018-0019541

(51) Int. Cl.
| | |
|---|---|
| *H01L 21/56* | (2006.01) |
| *H01L 25/00* | (2006.01) |
| *H01L 25/18* | (2006.01) |
| *H01L 23/00* | (2006.01) |
| *H01L 23/31* | (2006.01) |
| *H01L 23/48* | (2006.01) |
| *H01L 21/78* | (2006.01) |

(52) U.S. Cl.
CPC .......... *H01L 25/50* (2013.01); *H01L 21/565* (2013.01); *H01L 21/78* (2013.01); *H01L 23/3128* (2013.01); *H01L 23/481* (2013.01); *H01L 24/17* (2013.01); *H01L 24/30* (2013.01); *H01L 24/73* (2013.01); *H01L 24/94* (2013.01); *H01L 24/97* (2013.01); *H01L 25/18* (2013.01); *H01L 24/13* (2013.01); *H01L 24/16* (2013.01); *H01L 24/32* (2013.01); *H01L 24/81* (2013.01); *H01L 24/83* (2013.01); *H01L 2224/13025* (2013.01); *H01L 2224/13111* (2013.01); *H01L 2224/13147* (2013.01); *H01L 2224/13155* (2013.01); *H01L 2224/14181* (2013.01); *H01L 2224/16145* (2013.01); *H01L 2224/32145* (2013.01); *H01L 2224/33181* (2013.01); *H01L 2224/73204* (2013.01); *H01L 2224/81001* (2013.01); *H01L 2224/83001* (2013.01); *H01L 2224/8385* (2013.01); *H01L 2924/181* (2013.01)

(58) Field of Classification Search
CPC .................................................. H01L 21/565
See application file for complete search history.

(56) References Cited

U.S. PATENT DOCUMENTS

| | | | |
|---|---|---|---|
| 9,184,153 B2 | 11/2015 | Lu et al. | |
| 2013/0037952 A1* | 2/2013 | Jung | ................ H01L 25/0657 257/738 |
| 2014/0026431 A1* | 1/2014 | Nah | ................ H01L 21/50 33/562 |
| 2015/0132893 A1 | 5/2015 | Chan et al. | |
| 2018/0068958 A1* | 3/2018 | Cho | |
| 2018/0108592 A1* | 4/2018 | Hembree | ............... H01L 21/563 |

* cited by examiner

*Primary Examiner* — Daniel Whalen
(74) *Attorney, Agent, or Firm* — William Park & Associates Ltd.

(57) ABSTRACT

A method of fabricating semiconductor packages may include forming stack structures on a base die wafer, disposing a top die wafer on the stack structures, and forming a molding layer filling a space between the base die wafer and the top die wafer.

15 Claims, 12 Drawing Sheets

US 10,770,445 B2

METHODS OF FABRICATING SEMICONDUCTOR PACKAGES INCLUDING REINFORCEMENT TOP DIE

CROSS-REFERENCE TO RELATED APPLICATIONS

The present application claims priority under 35 U.S.C. 119(a) to Korean Application No. 10-2018-0019541, filed on Feb. 19, 2018, which is incorporated herein by references in its entirety.

BACKGROUND

1. Technical Field

The present disclosure relates to semiconductor package technologies and, more particularly, to methods of fabricating semiconductor packages.

2. Related Art

Semiconductor packages having a large capacity have been required in various electronic products. Accordingly, various package structures have been proposed to increase the number of semiconductor chips embedded in a single semiconductor package. For example, at least two semiconductor chips may be stacked to provide a stack package. However, form factors such as thickness and size of the semiconductor packages may be limited.

SUMMARY

According to an embodiment, a method of fabricating a semiconductor package may be provided. The method may include forming stack structures on a base die wafer, disposing a top die wafer on the stack structures, and forming a molding layer filling a space between the base die wafer and the top die wafer.

According to another embodiment, a method of fabricating a semiconductor package may be provided. The method may include forming stack structures on a base die wafer. A top die wafer having a trench may be disposed on the stack structures. The trench may be opened toward the base die wafer. A molding layer may be formed to fill a space between the base die wafer and the top die wafer.

DETAILED DESCRIPTION

Figure 1:
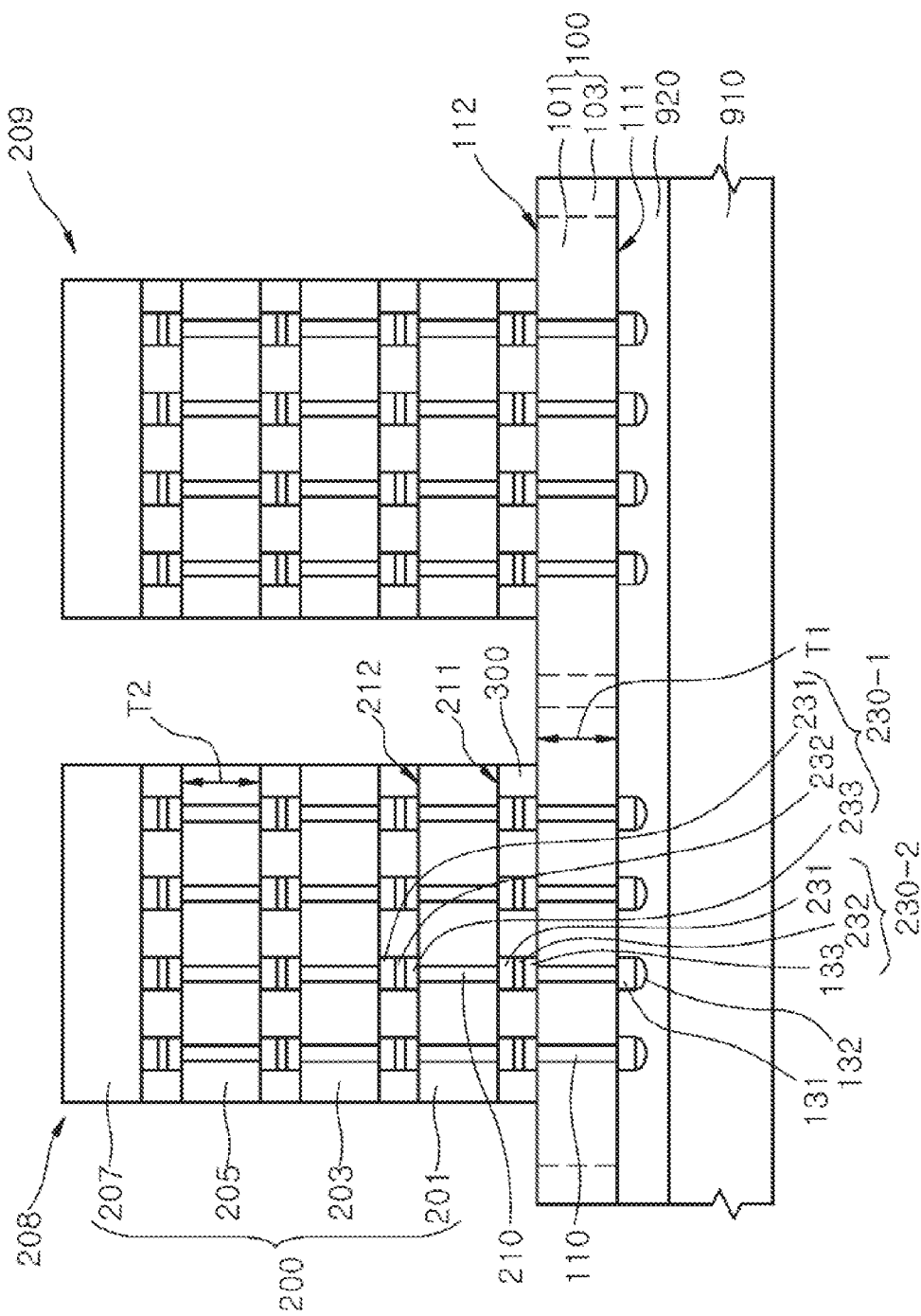
FIGS. 1 to 7 are cross-sectional views illustrating a method of fabricating semiconductor packages according to an embodiment.

Various embodiments of the present disclosure will be described hereinafter with reference to the accompanying drawings. However, the embodiments described here are for illustrative purposes only and are not intended to limit the scope of the present disclosure.

The terms used herein may correspond to words selected in consideration of their functions in embodiments of the present disclosure, and the meanings of the terms may be construed to be different according to ordinary skill in the art to which embodiments of the present disclosure belong. If defined in detail, the terms may be construed according to the definitions. Unless otherwise defined, the terms (including technical and scientific terms) used herein have the same meaning as commonly understood by one of ordinary skill in the art to which embodiments of the present disclosure belong. It will be understood that although the terms "first," "second," "third" etc. may be used herein to describe various elements, these elements should not be limited by these terms. These terms are only used to distinguish one element from another element, but not used to define only the element itself or to mean a particular sequence.

It will also be understood that when an element or layer is referred to as being "on," "over," "below," "under," or "outside" another element or layer, the element or layer may be in direct contact with the other element or layer, or intervening elements or layers may be present. Other words used to describe the relationship between elements or layers should be interpreted in a like fashion (e.g., "between" versus "directly between" or "adjacent" versus "directly adjacent").

Spatially relative terms, such as "beneath," "below," "lower," "above," "upper," "top," "bottom" and the like, may be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, when the device in the figures is turned over, elements described as below and/or beneath other elements or features would then be oriented above the other elements or features. The device may be otherwise oriented (rotated 90 degrees or at other orientations) and the spatially relative descriptors used herein interpreted accordingly.

A semiconductor package may include electronic devices such as semiconductor chips or semiconductor dies. The semiconductor chips or the semiconductor dies may be obtained by separating a semiconductor substrate such as a wafer into a plurality of pieces using a die sawing process. The semiconductor chips may correspond to memory chips, logic chips (including application specific integrated circuits (ASIC) chips), or system-on-chips (SoC). The memory chips may include dynamic random access memory (DRAM) circuits, static random access memory (SRAM) circuits, NAND-type flash memory circuits, NOR-type flash memory circuits, magnetic random access memory (MRAM) circuits, resistive random access memory (ReRAM) circuits, ferroelectric random access memory (FeRAM) circuits, or phase change random access memory (PcRAM) circuits which are integrated on the semiconductor substrate. The logic chips may include logic circuits which are integrated on the semiconductor substrate. The semiconductor package may be employed in communication systems such as mobile phones, electronic systems associated with biotechnology or health care, or wearable electronic systems.

Embodiments of the present disclosure illustrate various semiconductor packages corresponding to stack packages including a plurality of semiconductor dies or a plurality of semiconductor chips which are vertically stacked. Each of the semiconductor dies may include a through silicon via (TSV) structure. The TSV structure may correspond to an interconnection structure including a plurality of through electrodes or a plurality of through vias that vertically penetrate each semiconductor die. The semiconductor dies stacked in one semiconductor package may be electrically connected to each other by bumps. The bumps may be connection members connected to the TSV structure.

Embodiments of the present disclosure may also relate to a high bandwidth memory (HBM) package. The HBM package may include an HBM interface to improve data transmission speed between the HBM package and a processor chip. The HBM package may be realized using the TSV structure to increase the number of input/output (I/O) terminals. A processor chip supporting an operation of the HBM package may be an application specific integrated circuit (ASIC) chip including a central processing unit (CPU) or a graphics processing unit (GPU), a microprocessor or a microcontroller, an application processor (AP), a digital signal processing core, and an interface.

Same reference numerals refer to same elements throughout the specification. Even though a reference numeral is not mentioned or described with reference to a drawing, the reference numeral may be mentioned or described with reference to another drawing. In addition, even though a reference numeral is not shown in a drawing, it may be mentioned or described with reference to another drawing.

FIGS. 1 to 7 are cross-sectional views illustrating a method of fabricating semiconductor packages according to an embodiment. FIG. 8 is a cross-sectional view illustrating any one of the semiconductor packages fabricated by the method illustrated in FIGS. 1 to 7.

Referring to FIG. 1, a plurality of core dies 200 may be stacked on a base die wafer 100.

The base die wafer 100 may include a plurality of base die regions 101 and a peripheral region 103. The base die regions 101 may be connected to each other by the peripheral region 103. The peripheral region 103 may correspond to an intermediate region located between the base die regions 101. Each of the base die regions 101 may be a region in which a first integrated circuit is realized. The base die wafer 100 may be cut along the peripheral region 103 to separate the base die regions 101 from each other. The separate base die regions 101 may correspond to base dies. That is, the peripheral region 103 may correspond to a scribe lane.

The base die wafer 100 may have a first surface 111 and a second surface 112 which are opposite to each other. The first and second surfaces 111 and 112 of the base die wafer 100 may be two distinct surfaces of the base die wafer 100. For example, the first surface 111 of the base die wafer 100 may correspond to a bottom surface, and the second surface 112 of the base die wafer 100 may correspond to a top surface. The base die wafer 100 may be a semiconductor wafer, for example, a silicon wafer.

First connection terminals 131 may be disposed on the first surface 111 of the base die wafer 100. The first connection terminals 131 may be provided to electrically connect the first integrated circuits realized in the base die regions 101 to an external device (not shown). The first integrated circuits may be realized to be adjacent to the first surface 111 of the base die wafer 100.

The core dies 200 may be stacked on the second surface 112 of the base die wafer 100. Second connection terminals 133 may be stacked on the second surface 112 of the base die wafer 100 to electrically connect the core dies 200 to the base die wafer 100. The first connection terminals 131 and the second connection terminals 133 may be stacked on two different surfaces (i.e., the first and second surfaces 111 and 112) of the base die wafer 100, respectively.

The first connection terminals 131 may be electrically connected to the second connection terminals 133 through first through vias 110 disposed in the base die regions 101. The first through vias 110 may be disposed to substantially penetrate the base die regions 101. The first through vias 110 may be formed of through silicon vias (TSVs). Internal interconnection lines (not shown) may be additionally disposed in or on the base die wafer 100 to electrically connect the first through vias 110 to the first connection terminals 131. The first connection terminals 131 may be disposed to be vertically aligned with the first through vias 110 and the second connection terminals 133. Thus, the first connection terminals 131 may overlap with the first through vias 110 and the second connection terminals 133 in a plan view.

The first connection terminals 131 may be realized using bumps protruding from the first surface 111 of the base die wafer 100. In such a case, the first connection terminals 131 may be copper bumps. A first conductive adhesive layer 132 may be additionally disposed on end portions of the first connection terminals 131 opposite to the base die wafer 100. The first conductive adhesive layer 132 may include a solder layer. The solder layer included in the first conductive adhesive layer 132 may contain a tin-silver (Sn—Ag) alloy layer. The first conductive adhesive layer 132 may further include a barrier layer such as a nickel (Ni) layer which is located between the first connection terminals 131 and the solder layer (e.g., a tin-silver (Sn—Ag) alloy layer). The second connection terminals 133 may include copper bumps protruding from the second surface 112 of the base die wafer 100.

A thickness T1 corresponding to a distance between the first and second surfaces 111 and 112 of the base die wafer 100 may, for instance, be within the range of approximately a few micrometers to approximately several tens of micrometers. Thus, since the base die wafer 100 is too thin, it may be difficult to handle only the base die wafer 100. Accordingly, a carrier wafer 910 may be attached to the first surface 111 of the base die wafer 100 to more readily handle the base die wafer 100 without any warpage of or damage to the base die wafer 100. The carrier wafer 910 may be attached to the first surface 111 of the base die wafer 100 using a temporary adhesive layer 920. The carrier wafer 910 may be provided to fix the base die wafer 100 and to reinforce the rigidity of the base die wafer 100. The carrier wafer 910 may be a glass wafer or a silicon wafer. The temporary adhesive layer 920 may include an adhesive component whose adhesive strength is weakened when an ultraviolet (UV) ray is irradiated onto the temporary adhesive layer 920. Thus, the carrier wafer 910 may be easily detached from the base die wafer 100 using the UV ray. The first connection terminals 131 may be embedded in the temporary adhesive layer 920.

While the base die wafer 100 is fixed and supported by the carrier wafer 910, the core dies 200 may be stacked on the second surface 112 of the base die wafer 100 to provide a first stack structure 208 and a second stack structure 209. The first stack structure 208 and the second stack structure 209 may be laterally spaced apart from each other by a certain distance. The peripheral region 103 of the base die wafer 100 may be exposed by a space between the first and second stack structures 208 and 209. The stack structures 208 and 209 may be disposed to overlap with the base die regions 101, respectively. That is, in an embodiment, the first stack structure 208 may be disposed to overlap with a first base die region of the base die regions 101, and the second stack structure 209 may be disposed to overlap with a second base die region of the base die regions 101. The first base die region may be separated from the second base die region by the peripheral region 103.

Each of the first and second stack structures 208 and 209 may be formed by vertically stacking two or more core dies 200. Each of the core dies 200 may have a third surface 211 facing the second surface 112 of the base die wafer 100 and a fourth surface 212 located at an opposite side facing away from the second surface 112 of the base die wafer 100. Third connection terminals 231 may be disposed on the third surface 211 of each core die 200, and fourth connection terminals 233 may be disposed on the fourth surface 212 of each core die 200. A second conductive adhesive layer 232 may be coated on end portions of the third connection terminals 231. The third and fourth connection terminals 231 and 233 may be formed of copper bumps, and the second conductive adhesive layer 232 may be formed to include a solder layer and a barrier layer. Each of the core dies 200 may include second through vias 210 for substantially connecting the third connection terminals 231 to the fourth connection terminals 233. The second through vias 210 may be disposed to substantially penetrate the core dies 200.

The third and fourth connection terminals 231 and 233 and the second conductive adhesive layer 232 disposed between the vertically stacked core dies 200 may constitute first bump connection structures 230-1. The second through vias 210 and the first bump connection structures 230-1 may electrically connect the core dies 200, which are vertically stacked, to each other. The core dies 200 in each of the first and second stack structures 208 and 209 may include first to fourth core dies 201, 203, 205 and 207 which are sequentially stacked. In such a case, the first bump connection structures 230-1 between the first and second core dies 201 and 203 may include the fourth connection terminals 233 on the fourth surface 212 of the first core die 201, the third connection terminals 231 on the third surface 211 of the second core die 203, and the second conductive adhesive layer 232 between the third connection terminals 231 and the fourth connection terminals 233, Accordingly, the first core die 201 may be electrically connected to the second core die 203 through the first bump connection structures 230-1. The second and third core dies 203 and 205 may also be electrically connected to each other by the first bump connection structures 230-1. The third and fourth core dies 205 and 207 may also be electrically connected to each other by the first bump connection structures 230-1.

Each of the first, second, and third core dies 201, 203, and 205 may include the third and fourth connection terminals 231 and 233 and the second through vias 210. The fourth core die 207 corresponding to a topmost core die of each of the stack structures 208 and 209 may include the third connection terminals 231 without the fourth connection terminals 233 and the second through vias 210. Since no additional core die is stacked on the fourth surface 212 of the fourth core die 207, the fourth connection terminals 233 and the second through vias 210 may be absent on and in the fourth core die 207, respectively. However, in some other embodiments, the fourth core die 207 may also include the third and fourth connection terminals 231 and 233 and the second through vias 210.

The first core die 201 corresponding to a bottommost core die of each of the stack structures 208 and 209 may be electrically connected to any one of the base die regions 101 through second bump connection structures 230-2. Each of the second bump connection structures 230-2 may include the second connection terminal 133, the third connection terminal 231, and the second conductive adhesive layer 232.

The first core dies 201 may be attached to the base die regions 101 of the base die wafer 100 using an adhesive layer 300. The adhesive layer 300 may also be disposed between the first to fourth core dies 201, 203, 205, and 207 which are vertically stacked. The adhesive layer 300 may include a non-conductive film (NCF). Accordingly, the adhesive layer 300 may also electrically insulate the first bump connection structures 230-1 from each other as well as the second bump connection structures 230-2 from each other. In another embodiment, an underfill layer may be disposed between the base die region 101 and the first core die 201 as well as between the first to fourth core dies 201, 203, 205, and 207 which are sequentially stacked.

A second integrated circuit may be realized in each of the core dies 200. The core dies 200 may be semiconductor dies having substantially the same function. The core dies 200 may be semiconductor dies having substantially the same size. For example, each of the core dies 200 may have the same thickness T2.

The second integrated circuit may be different from the first integrated circuit realized in each of the base die regions 101. For example, the core dies 200 may be memory dies having a function of memory devices, and the base die regions 101 may be logic dies having a function of controller devices for controlling the core dies 200 corresponding to the memory devices. If the semiconductor package illustrated in FIG. 1 is an HBM package, the core dies 200 may be dynamic random access memory (DRAM) dies including data banks. The base die regions 101 may be semiconductor die regions, each of which includes a test circuit for testing the DRAM devices integrated in the core dies 200, a soft repairing circuit, an address circuit, a command circuit, and/or a physical layer for signal transmission.

Figure 2:
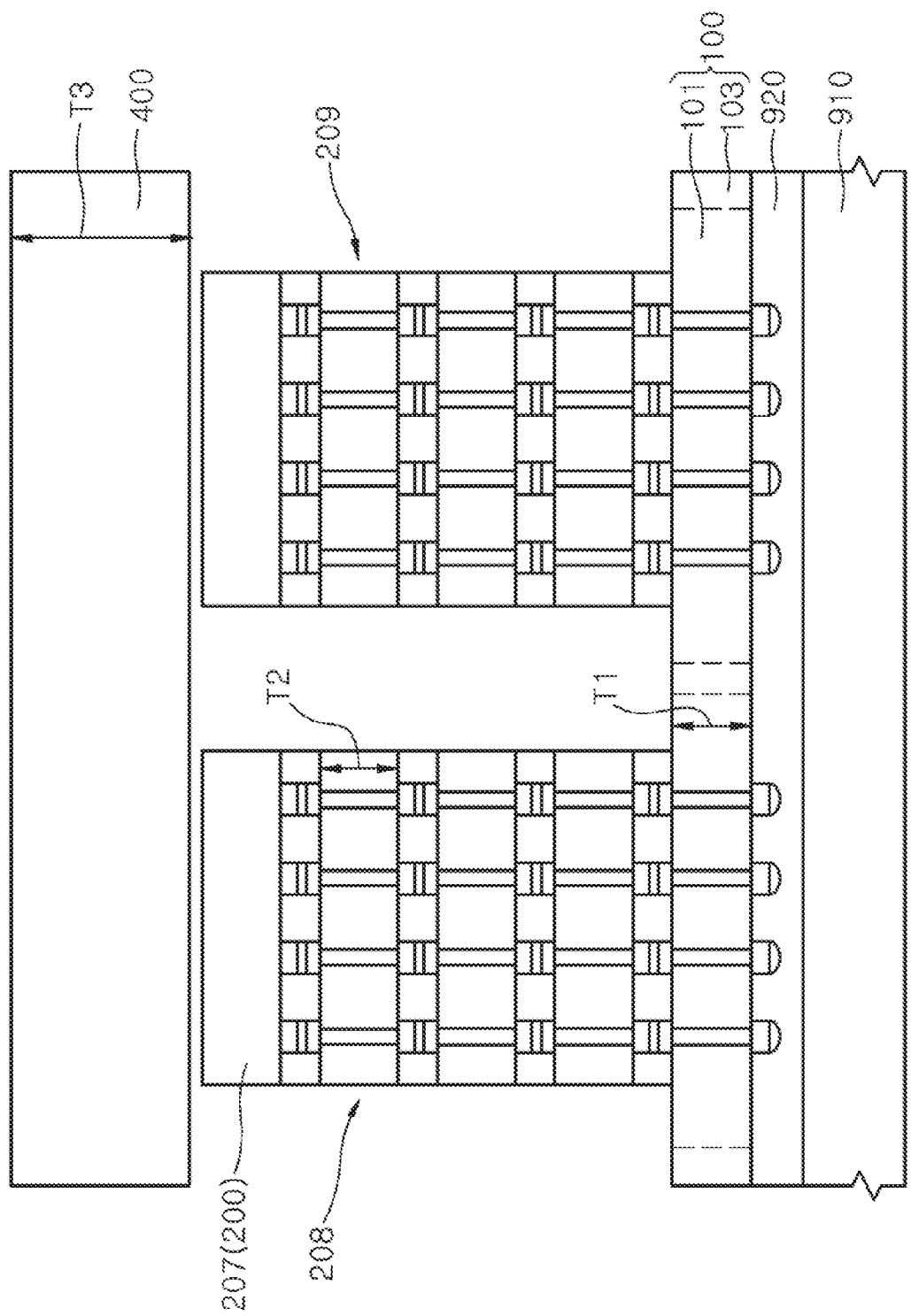
Figure 3:
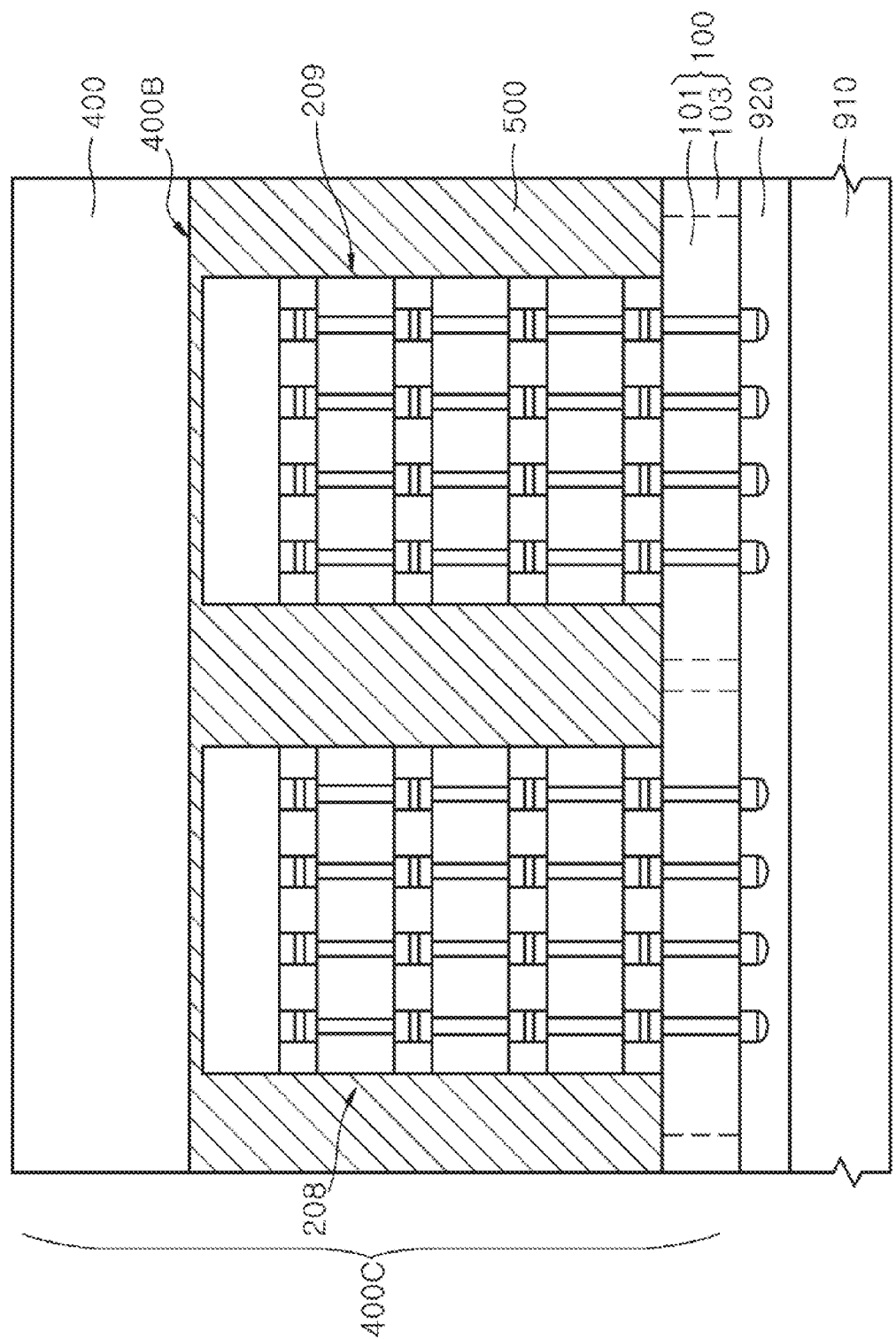

FIGS. 2 and 3 are cross-sectional views illustrating a step of disposing a top die wafer 400 on the stack structures 208 and 209 including the core dies 200.

Referring to FIG. 2, the top die wafer 400 may be disposed on the stack structures 208 and 209 to perform a molding process for forming a molding layer. The molding process may be performed using a mold template (not shown) including an upper mold (not shown) and a lower mold (not shown) facing the upper mold. The base die wafer 100 may be put into a molding space which is provided by the mold template. The molding process may be performed by filling an internal space (i.e., the molding space) between the upper mold and the lower mold with a molding material. The molding material may be an epoxy molding compound (EMC) material. Alternatively, the molding material may be an encapsulant material other than an EMC material.

In order to perform the molding process, the carrier wafer 910 to which the base die wafer 100 is attached may be put on the lower mold, and the top die wafer 400 may then be put in the upper mold. In another embodiment, while the top die wafer 400 is attached to top surfaces of the stack structures 208 and 209, the carrier wafer 910 may be loaded onto the lower mold. That is, the top die wafer 400 may be attached to the fourth core dies 207.

The top die wafer 400 may have a thickness T3 which is greater than the thickness T2 of each of the core dies 200. The thickness T3 of the top die wafer 400 may also be greater than the thickness T1 of the base die wafer 100. The top die wafer 400 may be a silicon wafer which is similar to the base die wafer 100. The top die wafer 400 may be a dummy wafer in which no integrated circuit is formed.

Referring to FIG. 3, a molding material may be supplied into the molding space to form a molding layer 500. The molding layer 500 may be supplied on the second surface 112 of the base die wafer 100 to cover the stack structures 208 and 209 including the core dies 200. The molding layer 500 may fill a space between the base die wafer 100 and the top die wafer 400.

The molding layer 500 may be formed to be in contact with a bottom surface 400B of the top die wafer 400. Since the molding layer 500 is formed to contact the bottom surface 400B of the top die wafer 400, an extra adhesive layer for attaching the top die wafer 400 to the stack structures 208 and 209 may not be required. The molding layer 500 may extend to fill gap regions between the top die wafer 400 and the stack structures 208 and 209. In such a case, the top die wafer 400 may be located to be spaced apart from the stack structures 208 and 209 by a certain distance.

As a result of forming the molding layer 500, a wafer package structure 400C including the base die wafer 100, the stack structures 208 and 209, the molding layer 500, and the top die wafer 400 may be formed. The top die wafer 400 may be provided to reinforce the rigidity of the wafer package structure 400C.

The molding layer 500 may include a highly polymerized compound material such as an EMC material. The molding material such as an EMC material tends to shrink in volume while the molding material is cured. A volume of the EMC material may be reduced due to deformation of a molecular structure of the EMC material while the epoxy of the EMC material is cured to change into a C-stage. The top die wafer 400 may have the rigidity resisting a volume shrinkage phenomenon of the molding layer 500 while the molding layer 500 is cured. Since the top die wafer 400 has the thickness T3 greater than the thickness T1 of the base die wafer 100, the top die wafer 400 may have the rigidity enough to resist a volume shrinkage phenomenon of the molding layer 500. That is, even though the molding layer 500 is cured to cause a shrinkage phenomenon of the molding layer 500, the top die wafer 400 may maintain a flat shape without warpage. Since the top die wafer 400 maintains a flat shape, warpage of the wafer package structure 400C may be prevented while the molding layer 500 is cured.

Since warpage of the wafer package structure 400C is prevented, the wafer package structure 400C may maintain a flat shape. Thus, it may be possible to stably load the wafer package structure 400C into a process apparatus or a test apparatus without errors. The process apparatus or the test apparatus may include a supporter such as a chuck for supporting the wafer package structure 400C. The supporter may be generally configured to support a wafer having a flat shape. Thus, the wafer package structure 400C may be stably mounted on the supporter without any errors because the wafer package structure 400C has a flat shape without warpage. If the wafer package structure 400C is warped to have a non-flat shape, it may be impossible to mount the wafer package structure 400C on the supporter of the process apparatus or the test apparatus.

The wafer package structure 400C may then be separated from the upper mold and the lower mold. In such a case, the carrier wafer 910 may still be attached to the base die wafer 100.

Figure 4:
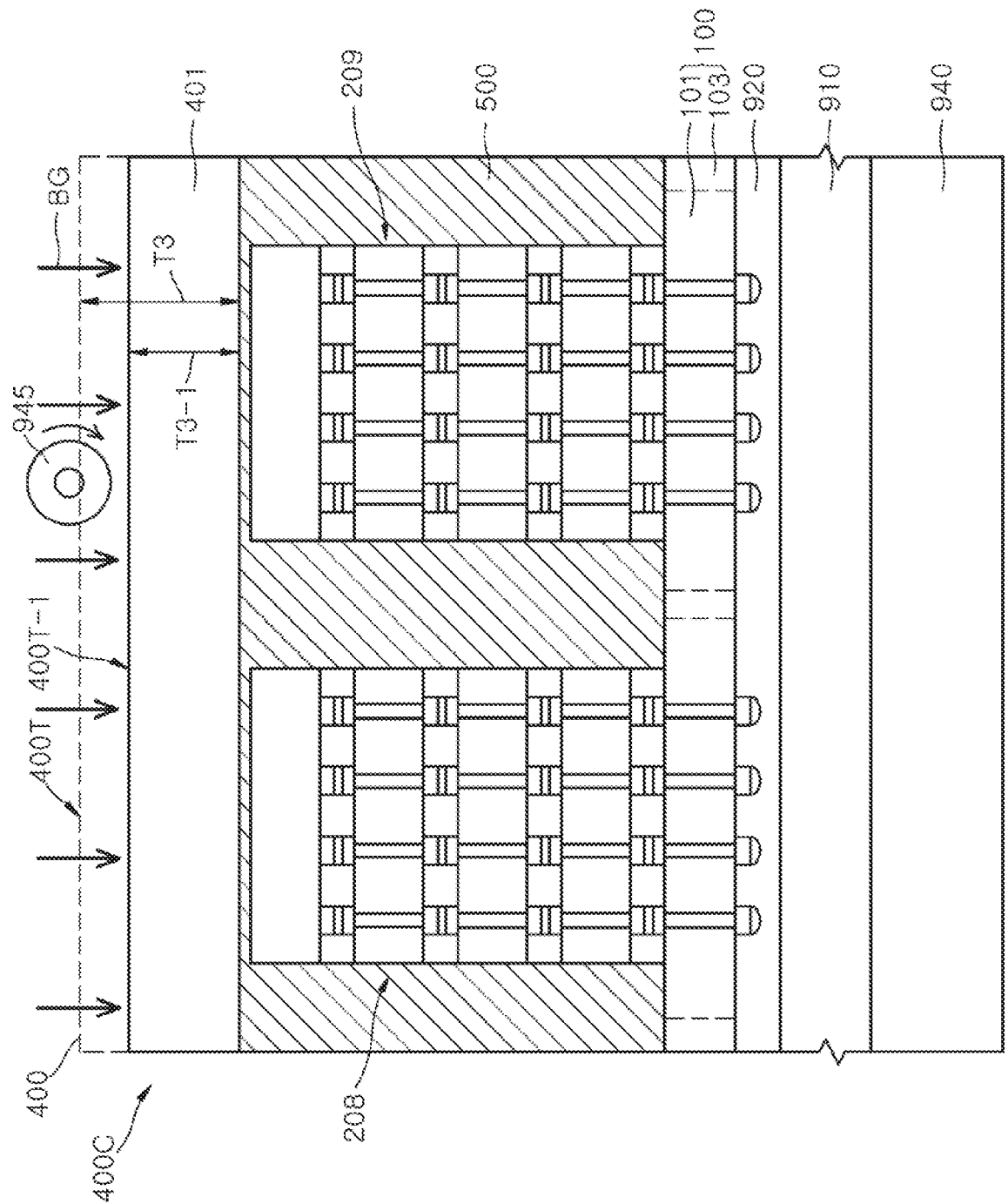

Referring to FIG. 4, the thickness T3 of the top die wafer 400 may be reduced to form a recessed top die wafer 401 having a reduced thickness T3-1. Specifically, a recession process may be applied to a top surface 400T of the top die wafer 400 to form the recessed top die wafer 401 having a recessed top surface 400T-1. The recession process may be performed by applying a back grinding process BG to the top surface 400T of the top die wafer 400. For example, the carrier wafer 910 may be mounted on a chuck 940 of a back grinding apparatus, and the top surface 400T of the top die wafer 400 may be ground using a grinder 945 of the back grinding apparatus. Since the recessed top die wafer 401 has a reduced thickness T3-1, a total thickness of the wafer package structure 400C may be reduced after the back grinding process BG is performed. In some other embodiments, the back grinding process BG may be omitted.

Figure 5:
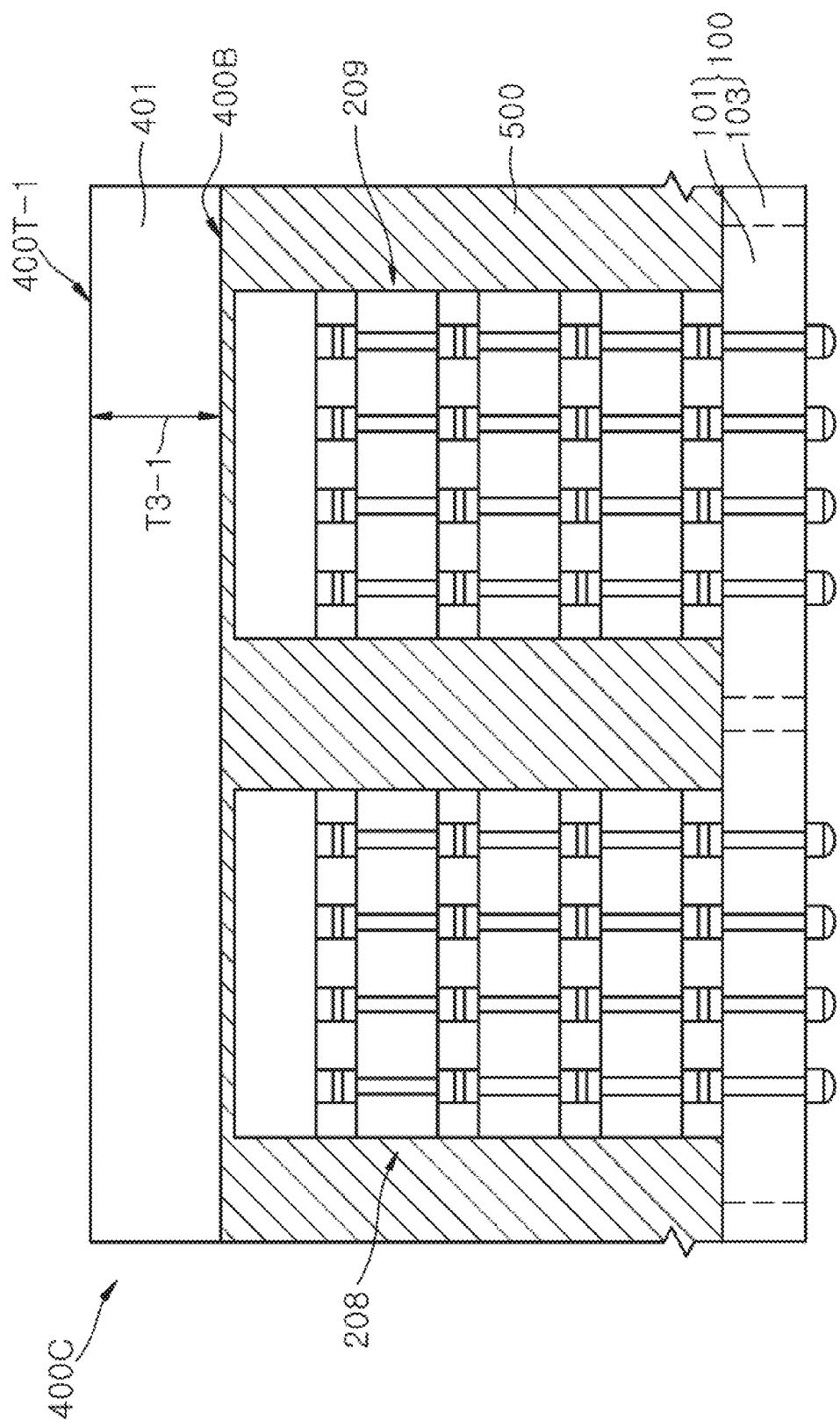

Referring to FIG. 5, the carrier wafer (910 of FIG. 4) may be detached from the wafer package structure 400C. The carrier wafer (910 of FIG. 4) may be detached from the wafer package structure 400C by weakening the adhesive strength of the temporary adhesive layer (920 of FIG. 4). When the carrier wafer (910 of FIG. 4) is detached from the wafer package structure 400C, the temporary adhesive layer 920 may also be removed from the base die wafer 100.

After the carrier wafer (910 of FIG. 4) is detached from the wafer package structure 400C, the molding layer 500 may be disposed between the base die wafer 100 and the recessed top die wafer 401.

Figure 6:
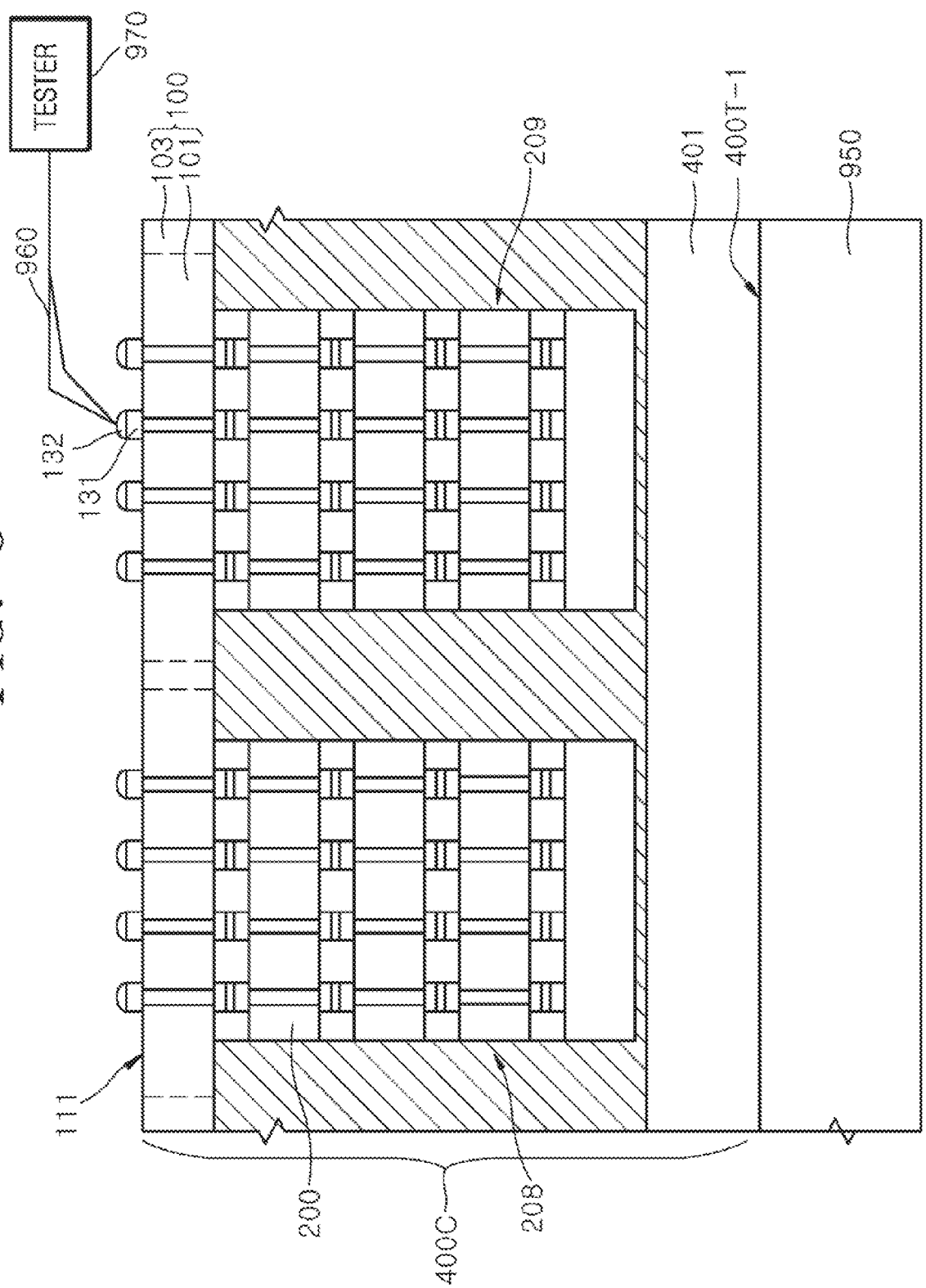

Referring to FIG. 6, the wafer package structure 400C may be tested using a tester 970. The tester 970 may correspond to a probe station. After the wafer package structure 400C is formed, various subsequent processes may be applied to the wafer package structure 400C. Since warpage of the wafer package structure 400C is suppressed by the recessed top die wafer 401, the subsequent processes of the wafer package structure 400C may be normally performed.

In the event that an electrical test process is applied to the wafer package structure 400C with a test apparatus including the tester 970, the wafer package structure 400C may be mounted on a supporter 950 of the test apparatus. In such a case, the recessed top surface 400T-1 of the recessed top die wafer 401 of the wafer package structure 400C may be in contact with the supporter 950 of the test apparatus, and the first surface 111 of the base die wafer 100 may be exposed. Test probes 960 of the tester 970 may be connected to the first conductive adhesive layer 132, coated on the first connection terminals 131 protruding from the first surface 111 of the base die wafer 100, to execute the electrical test process. The integrated circuits realized in the base die regions 101 and the core dies 200 may be tested using the probes 960 of the tester 970.

Since warpage of the wafer package structure 400C is still suppressed by the recessed top die wafer 401, subsequent various processes applied to the wafer package structure 400C may be normally performed.

Figure 7:
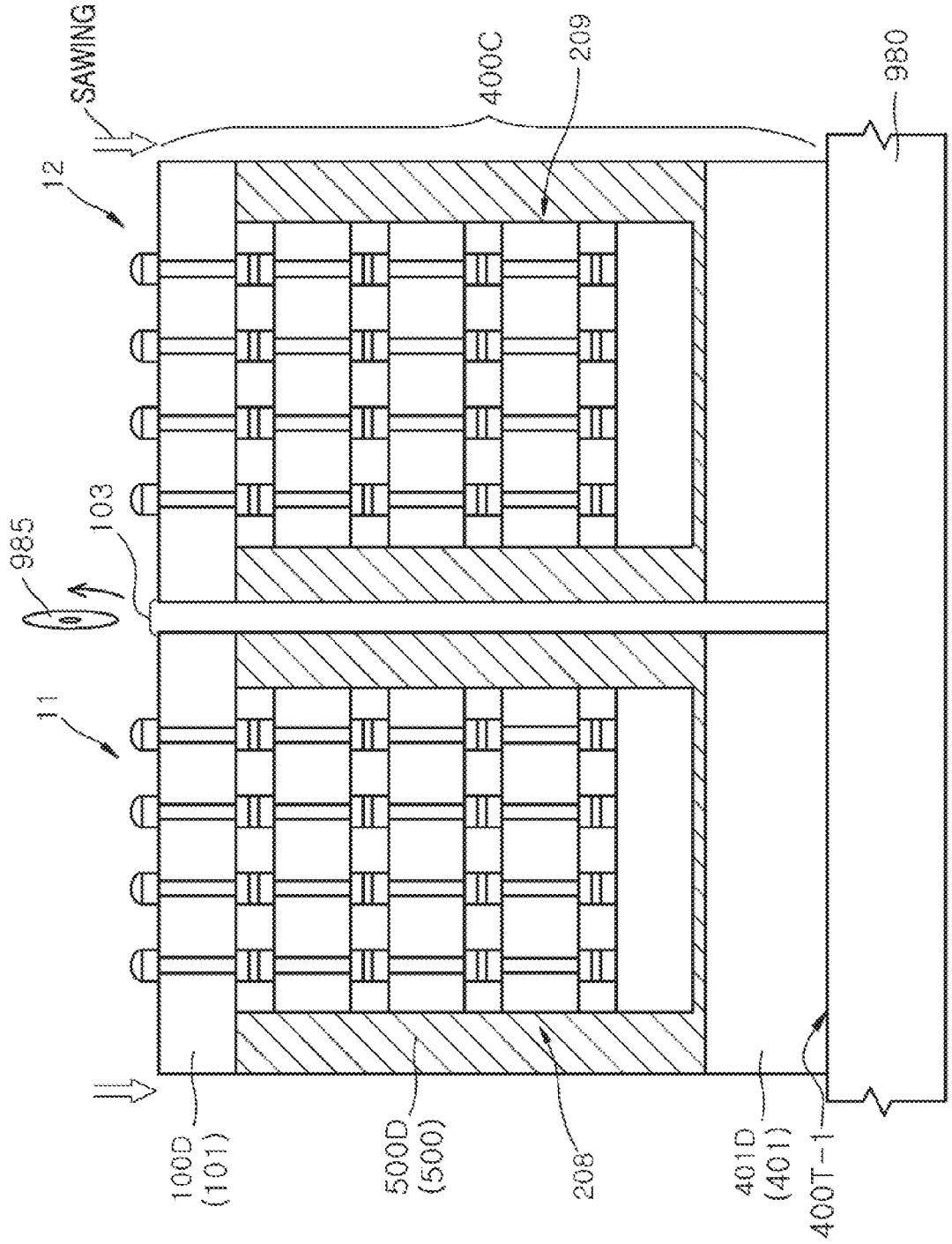
Figure 8:
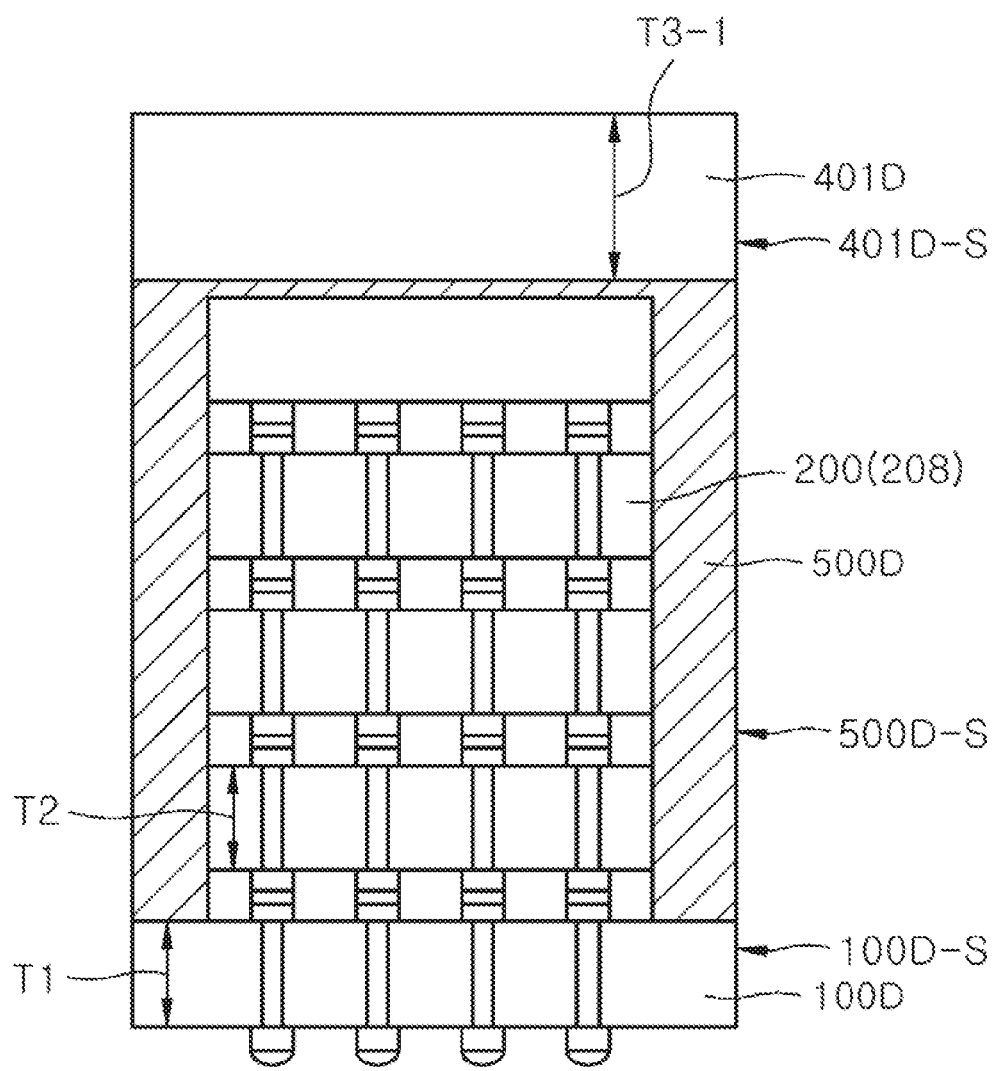
FIG. 8 is a cross-sectional view illustrating a semiconductor package according to an embodiment.

Referring to FIG. 7, the wafer package structure 400C may be cut along the peripheral region 103 of the base die wafer 100 to provide discrete semiconductor packages 11 and 12 which are separated from each other. Specifically, after the electrical test process is performed, the wafer package structure 400C may be mounted on a supporter 980 of a package sawing machine. Since warpage of the wafer package structure 400C is still suppressed by the recessed top die wafer 401, the wafer package structure 400C may be stably and normally mounted on the supporter 980, and a package sawing process may be normally performed.

The recessed top surface 400T-1 of the recessed top die wafer 401 of the wafer package structure 400C may be in contact with the supporter 980 to perform the package sawing process. The package sawing machine may also include a sawing blade 985 for cutting the wafer package structure 400C. The base die wafer 100, the molding layer 500, and the recessed top die wafer 401 may be cut along the peripheral region 103 of the base die wafer 100 using the sawing blade 985. That is, the peripheral region 103 of the base die wafer 100, a portion of the molding layer 500 overlapping with the peripheral region 103, and a portion of the recessed top die wafer 401 overlapping with the peripheral region 103 may be removed by the sawing blade 985 to provide the first and second discrete semiconductor packages 11 and 12 which are separated from each other.

Referring to FIGS. 7 and 8, the first discrete semiconductor package 11 may include a top die 401D, a base die 100D, and a molding layer 500D disposed between the top die 401D and the base die 100D. The first stack structure 208 comprised of the core dies 200 may be disposed in the molding layer 500D. The top die 401D may be a portion separated from the top die wafer 401, and the base die 100D may correspond to any one of the base die regions 101 separated from the base die wafer 100. Side surfaces 500D-S of the molding layer 500D may be vertically aligned with and connected to side surfaces 100D-S of the base die 100D, respectively. Similarly, the side surfaces 500D-S of the molding layer 500D may be vertically aligned with and connected to side surfaces 401D-S of the top die 401D, respectively. The thickness T3-1 of the top die 401D may be greater than the thickness T1 of the base die 100D and the thickness T2 of each of the core dies 200.

Figure 9:
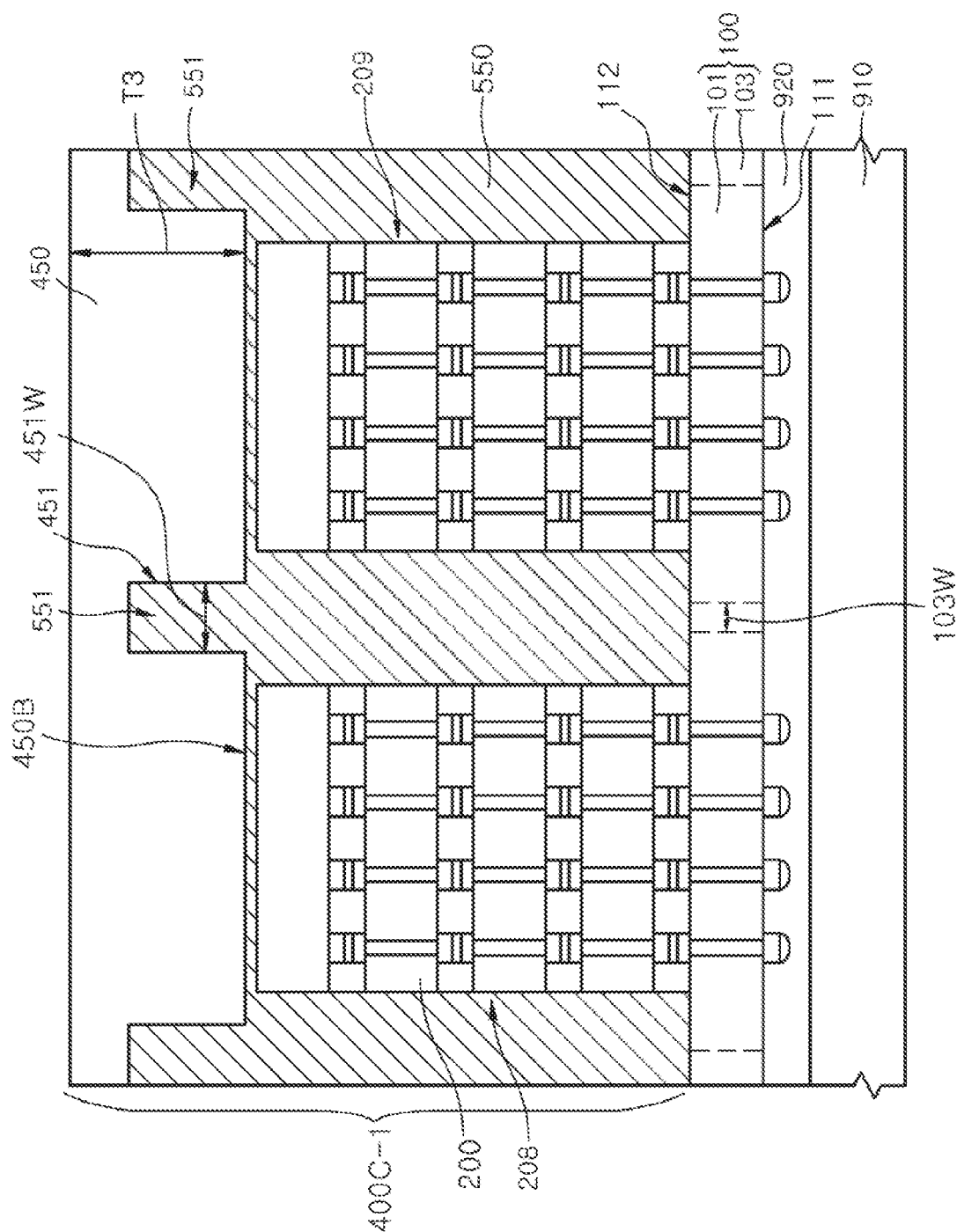
FIGS. 9 and 10 are cross-sectional views illustrating a method of fabricating semiconductor packages according to another embodiment.
Figure 10:
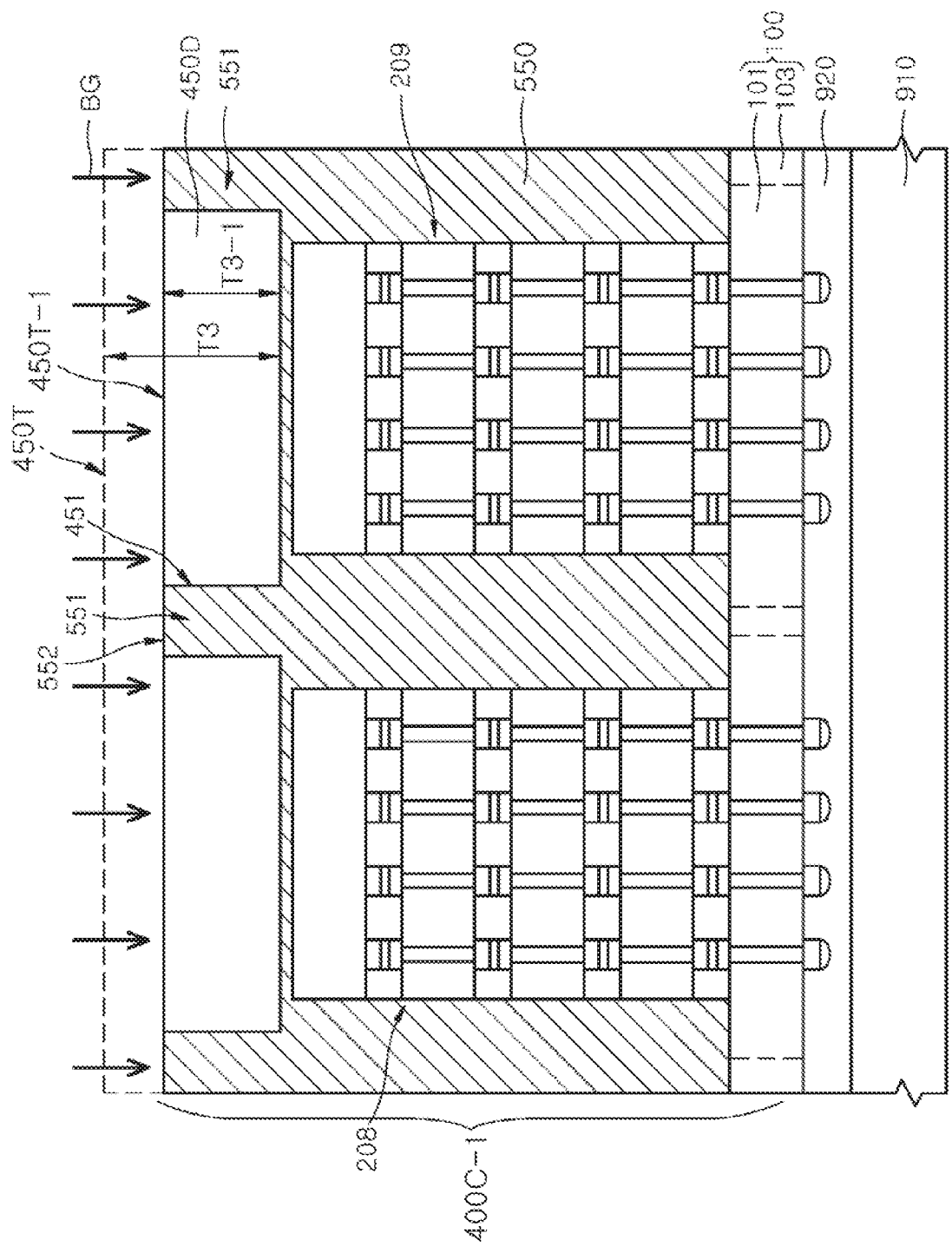
Figure 11:
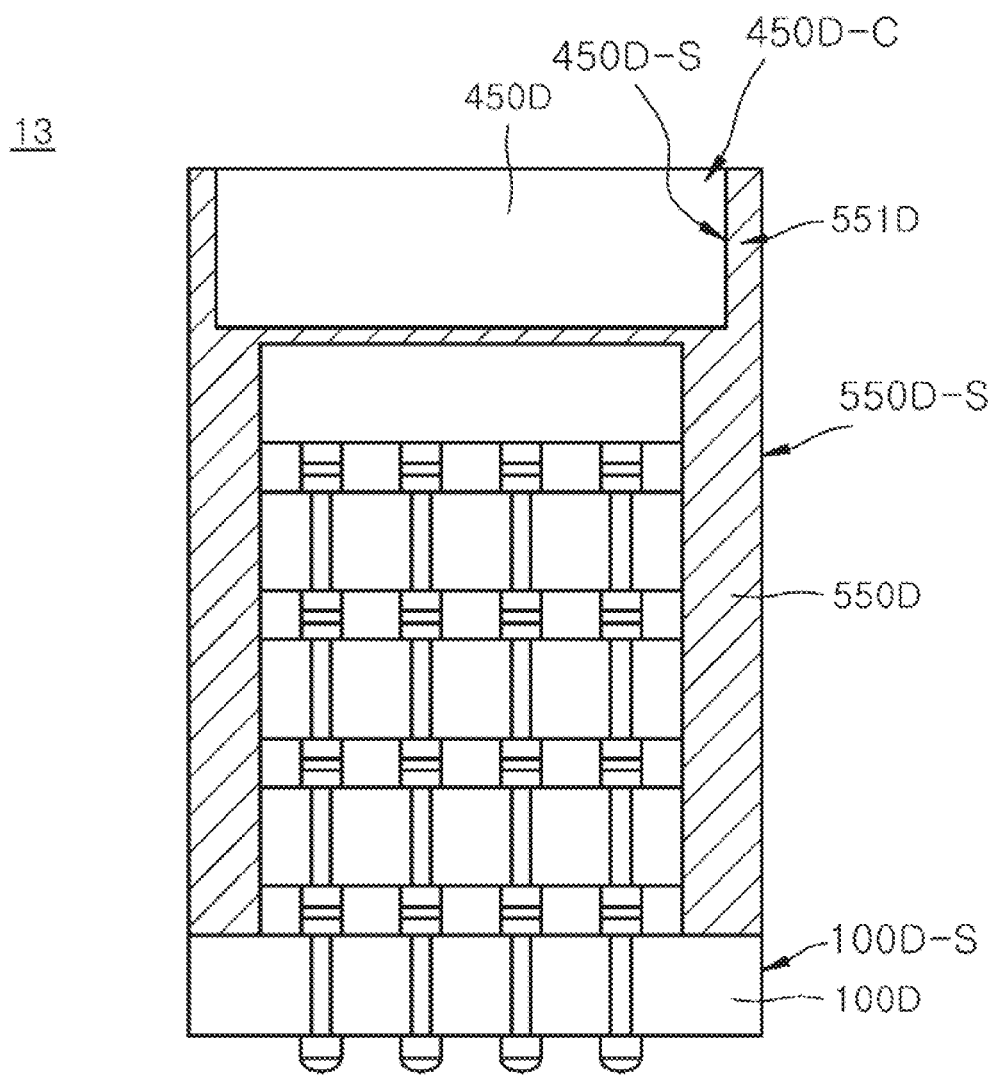
FIG. 11 is a cross-sectional view illustrating a semiconductor package according to another embodiment.

FIGS. 9 and 10 are cross-sectional views illustrating a method of fabricating semiconductor packages according to another embodiment. FIG. 11 is a cross-sectional view illustrating one of the semiconductor packages fabricated by the method illustrated in FIGS. 9 and 10. In FIGS. 9, 10, and 11, the same reference numerals denote the same elements.

Referring to FIG. 9, the base die wafer 100 may be attached to the carrier wafer 910 using the temporary adhesive layer 920. The core dies 200 may be stacked on the second surface 112 of the base die wafer 100. As a result, the first stack structure 208 and the second stack structure 209 may be laterally spaced apart from each other by a certain distance, as described with reference to FIG. 1. Thus, the stack structures 208 and 209 may be formed to respectively overlap with the base die regions 101, and the peripheral region 103 of the base die wafer 100 may be exposed by a space between the stack structures 208 and 209. That is, in an embodiment, the first stack structure 208 may be formed to overlap with a first base die region of the base die regions 101, and the second stack structure 209 may be formed to overlap with a second base die region of the base die regions 101; the first base die region may be separated from the second base die region by the peripheral region 103.

A molding layer 550 may be formed on the base die wafer 100 using a molding process. In such a case, a top die wafer 450 may be disposed on the stack structures 208 and 209 so that the molding layer 550 is bonded to the top die wafer 450. The bond between the molding layer 550 and the top die wafer 450 may be achieved by the same molding process as described with reference to FIGS. 2 and 3.

The top die wafer 450 may include a bottom surface 450B providing a groove-shaped trench 451, and the molding layer 550 may be bonded to the bottom surface 450B of the top die wafer 450. The trench 451 may be opened toward the base die wafer 100. The trench 451 may be disposed to vertically overlap with the peripheral region 103 of the base die wafer 100. Thus, the trench 451 may extend along the peripheral region 103 of the base die wafer 100 when viewed from a plan view. The trench 451 may be provided to have a width 451W which is greater than a width 103W of the peripheral region 103. Accordingly, an entire portion of the peripheral region 103 may be fully included in the trench 451 in a plan view.

The molding layer 550 may extend to have a filling portion 551 that fills the trench 451. A contact area between the molding layer 550 and the top die wafer 450 may increase due to the presence of the filling portion 551 of the molding layer 550. Thus, a coherence force or an adhesive strength between the molding layer 550 and the top die wafer 450 may also increase.

Referring to FIG. 10, the thickness (T3 of FIG. 9) of the top die wafer 450 may be reduced to form recessed top dies 450D having the reduced thickness T3-1. Specifically, a recession process may be applied to a top surface 450T of the top die wafer 450 to form the recessed top dies 450D having a recessed top surface 450T-1. The recession process may be performed by applying the back grinding process BG to the top surface 450T of the top die wafer 450. In such a case, the back grinding process BG may be performed to expose a top surface 552 of the filling portion 551 in the trench 451. If the top surface 552 of the filling portion 551 is exposed by the back grinding process BG, the top die wafer 450 may be divided into the recessed top dies 450D which are separated from each other. That is, the top die wafer 450 may be automatically divided into the recessed top dies 450D by the recession process for reducing the thickness T3 of the top die wafer 450. The recessed top dies 450D may be isolated from each other by the filling portion 551 of the molding layer 550. After the back grinding process BG, a wafer package structure 400C-1 including the recessed top dies 450D may be provided.

Subsequently, the wafer package structure 400C-1 may be cut using a package sawing process to provide discrete semiconductor packages (13 of FIG. 11) which are separated from each other. That is, the peripheral region 103 of the base die wafer 100, a portion of the molding layer 550 overlapping with the peripheral region 103, and the filling portion 551 of the molding layer 550 overlapping with the peripheral region 103 may be removed to provide the discrete semiconductor packages 13 which are separated from each other.

Referring to FIG. 11, each of the discrete semiconductor packages 13 may include the top die 450D, the base die 100D, and a molding layer 550D disposed between the top die 450D and the base die 100D. A portion 551D of the molding layer 550D may remain to cover side surfaces 450D-S of the top die 450D. The portion 551D of the molding layer 550D may correspond to a portion of the filling portion (551 of FIG. 10) of the molding layer 550. Since the portion 551D of the molding layer 550D covers the side surfaces 450D-S of the top die 450D, a portion of each of upper corners 450D-C of the top die 450D may be covered and protected by the portion 551D of the molding layer 550D. The side surfaces 100D-S of the base die 100D may be vertically aligned with and connected to side surfaces 550D-S of the molding layer 550D, respectively.

According to embodiments of the present disclosure described above, a wafer package structure including a base die wafer and a top die wafer may be provided. The base die wafer and the top die wafer may be disposed to be symmetric with respect to a molding layer disposed between the base die wafer and the top die wafer. The top die wafer may suppress a warpage phenomenon of the wafer package structure even though the molding layer is shrunk by a curing process.

Figure 12:
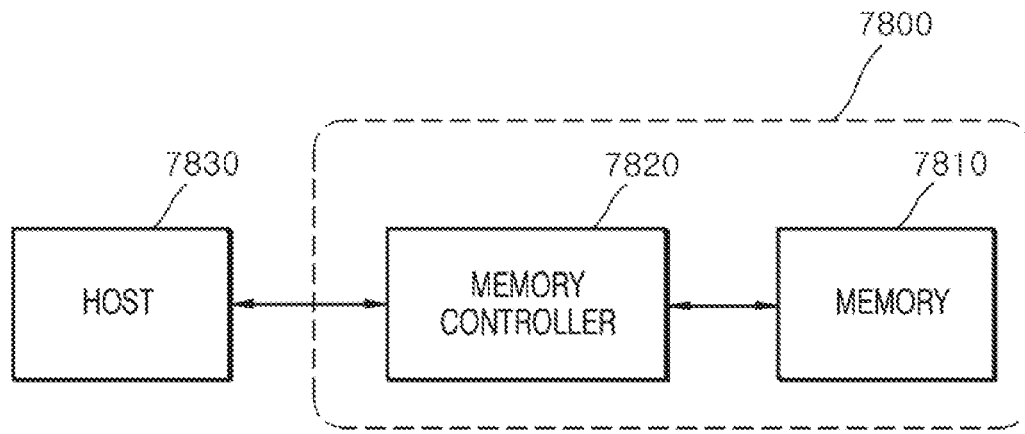
FIG. 12 is a block diagram illustrating an electronic system employing a memory card including a semiconductor package according to an embodiment.

FIG. 12 is a block diagram illustrating an electronic system including a memory card 7800 employing at least one semiconductor package according to embodiments of the present disclosure. The memory card 7800 may include a memory 7810, such as a nonvolatile memory device, and a memory controller 7820. The memory 7810 and the memory controller 7820 may store data or read out the stored data. At least one of the memory 7810 and the memory controller 7820 may include at least one semiconductor package according to embodiments of the present disclosure.

The memory 7810 may include a nonvolatile memory device fabricated according to embodiments of the present disclosure. The memory controller 7820 may control the memory 7810 such that stored data is read out or data is stored in response to a read/write request from a host 7830.

Figure 13:
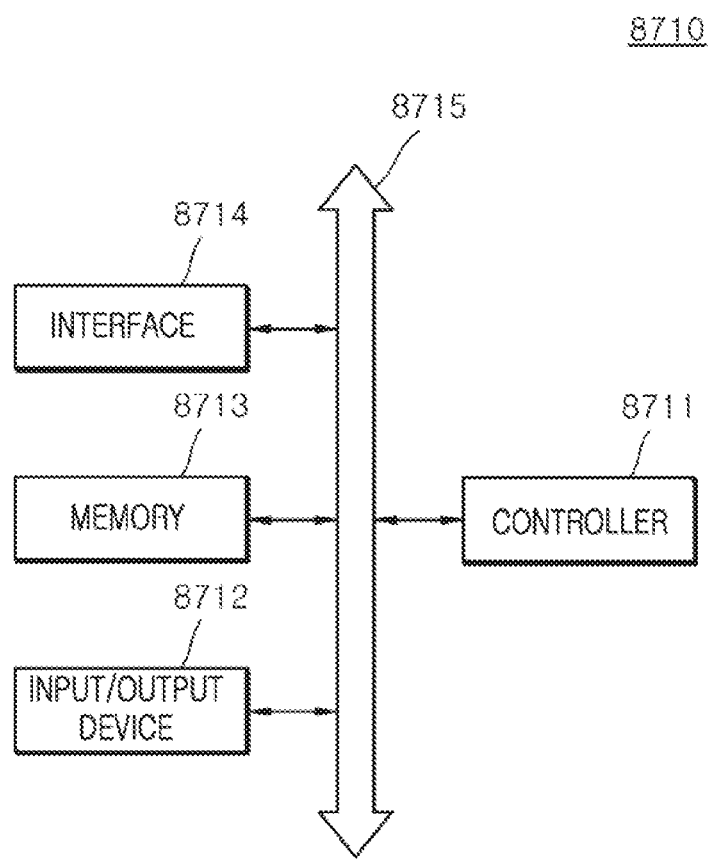
FIG. 13 is a block diagram illustrating another electronic system including a semiconductor package according to an embodiment.

FIG. 13 is a block diagram illustrating an electronic system 8710 including at least one semiconductor package according to embodiments of the present disclosure. The electronic system 8710 may include a controller 8711, an input/output device 8712, and a memory 8713. The controller 8711, the input/output device 8712, and the memory 8713 may be coupled with one another through a bus 8715 providing a path through which data move.

In an embodiment, the controller 8711 may include one or more microprocessor, digital signal processor, microcontroller, and/or logic device capable of performing the same functions as these components. The controller 8711 or the memory 8713 may include one or more semiconductor packages according to embodiments of the present disclosure. The input/output device 8712 may include at least one selected among a keypad, a keyboard, a display device, a touchscreen, and so forth. The memory 8713 is a device for storing data. The memory 8713 may store data and/or commands to be executed by the controller 8711, and the like.

The memory 8713 may include a volatile memory device such as a DRAM and/or a nonvolatile memory device such as a flash memory. For example, a flash memory may be mounted to an information processing system such as a mobile terminal or a desktop computer. The flash memory may constitute a solid state disk (SSD). In this case, the electronic system 8710 may stably store a large amount of data in a flash memory system.

The electronic system 8710 may further include an interface 8714 configured to transmit and receive data to and from a communication network. The interface 8714 may be a wired or wireless type. For example, the interface 8714 may include an antenna or a wired or wireless transceiver.

The electronic system 8710 may be realized as a mobile system, a personal computer, an industrial computer, or a logic system performing various functions. For example, the mobile system may be any one of a personal digital assistant (PDA), a portable computer, a tablet computer, a mobile phone, a smart phone, a wireless phone, a laptop computer, a memory card, a digital music system, and an information transmission/reception system.

If the electronic system 8710 is an equipment capable of performing wireless communication, the electronic system 8710 may be used in a communication system using a technique of CDMA (code division multiple access), GSM (global system for mobile communications), NADC (North American digital cellular), E-TDMA (enhanced-time division multiple access), WCDMA (wideband code division multiple access), CDMA2000, LTE (long term evolution), or WiBro (wireless broadband Internet).

Embodiments of the present disclosure have been disclosed for illustrative purposes. Those skilled in the art will appreciate that various modifications, additions, and substitutions are possible without departing from the scope and spirit of the present disclosure and the accompanying claims.

What is claimed is:

1. A method of fabricating semiconductor packages, the method comprising:
    forming stack structures on a base die wafer;
    disposing a top die wafer on the stack structures; and
    forming a molding layer filling a space between the base die wafer and the top die wafer,
    wherein the stack structures are comprised of core dies,
    wherein the base die wafer includes base die regions in which integrated circuits are realized and a peripheral region between the base die regions; and
    wherein the stack structures overlap with the base die regions, respectively, in a plan view,
    further comprising removing the peripheral region of the base die wafer, a portion of the molding layer overlapping with the peripheral region, and a portion of the top die wafer overlapping with the peripheral region.

2. The method of claim 1, wherein the top die wafer has a thickness which is greater than a thickness of the base die wafer.

3. The method of claim 1, wherein the top die wafer has a thickness which is greater than a thickness of each of the core dies.

4. The method of claim 1, wherein the top die wafer is a dummy silicon wafer.

5. The method of claim 1, wherein each of the base die regions further includes first through vias that substantially penetrate the base die region.

6. The method of claim 5,
    wherein each of the core dies further includes second through vias that substantially penetrate the core die; and
    wherein the second through vias are electrically connected to the first through vias.

7. A method of fabricating semiconductor packages, the method comprising:
    forming stack structures on a base die wafer;
    disposing a top die wafer on the stack structures; and
    forming a molding layer filling a space between the base die wafer and the top die wafer,
    wherein the stack structures are comprised of core dies,
    wherein the base die wafer includes base die regions in which integrated circuits are realized and a peripheral region between the base die regions;
    wherein the stack structures overlap with the base die regions, respectively, in a plan view,
    wherein the core dies are memory semiconductor dies; and
    wherein each of the base die regions is a logic semiconductor die in which a controller device for controlling the memory semiconductor dies is integrated.

8. A method of fabricating semiconductor packages, the method comprising:
    forming stack structures on a base die wafer;
    disposing a top die wafer having a trench, which is opened toward the base die wafer, on the stack structures; and
    forming a molding layer filling a space between the base die wafer and the top die wafer,
    wherein the base die wafer includes base die regions in which integrated circuits are realized and a peripheral region between the base die regions;
    wherein the stack structures overlap with the base die regions, respectively, in a plan view; and wherein the trench of the top die wafer is disposed to overlap with the peripheral region of the base die wafer.

9. The method of claim 8, wherein the top die wafer has a thickness which is greater than a thickness of the base die wafer.

10. The method of claim 8, wherein the stack structures are comprised of core dies.

11. The method of claim 10, wherein the top die wafer has a thickness which is greater than a thickness of each of the core dies.

12. The method of claim 8, wherein the molding layer extends to have a filling portion that fills the trench of the top die wafer overlapping with the peripheral region of the base die wafer, and the method further comprises reducing a thickness of the top die wafer to expose a top surface of the filling portion of the molding layer after forming the molding layer.

13. The method of claim 12, wherein the top die wafer is divided into top dies which are isolated from each other by the filling portion if the top surface of the filling portion is exposed.

14. The method of claim 12, further comprising removing the peripheral region of the base die wafer, a portion of the molding layer overlapping with the peripheral region, and a portion of the filling portion of the molding layer overlapping with the peripheral region.

15. The method of claim 8, wherein the trench of the top die wafer has a width which is greater than a width of the peripheral region of the base die wafer.

* * * * *